(12) United States Patent
Heerens (10) Patent No.: US 8,235,212 B2
(45) Date of Patent: Aug. 7, 2012

(54) MASK TRANSPORT SYSTEM CONFIGURED TO TRANSPORT A MASK INTO AND OUT OF A LITHOGRAPHIC APPARATUS

(75) Inventor: Gert-Jan Heerens, Schoonhoven (NL)

(73) Assignee: ASML Netherlands B.V., Veldhoven (NL)

( * ) Notice: Subject to any disclaimer, the term of this patent is extended or adjusted under 35 U.S.C. 154(b) by 132 days.

(21) Appl. No.: 12/483,940

(22) Filed: Jun. 12, 2009

(65) Prior Publication Data

US 2009/0262327 A1    Oct. 22, 2009

Related U.S. Application Data

(63) Continuation of application No. 10/744,095, filed on Dec. 24, 2003, now abandoned.

(30) Foreign Application Priority Data

Dec. 27, 2002    (EP) .................................... 02080457

(51) Int. Cl.
*B65D 85/00* (2006.01)
*B65D 85/48* (2006.01)
(52) U.S. Cl. ........................................ 206/454; 206/722
(58) Field of Classification Search .................. 206/454, 206/455, 722, 723, 710, 711, 521, 706, 724; 355/74, 30, 72, 75; 430/5; 220/580, 227, 220/23.87, 23.89, 366.1, 785; 414/939
See application file for complete search history.

(56) References Cited

U.S. PATENT DOCUMENTS

| 3,615,006 A | * | 10/1971 | Freed | 206/454 |
| 3,656,840 A | | 4/1972 | Smith et al. | |
| 4,401,434 A | | 8/1983 | Harris | |
| 4,634,270 A | | 1/1987 | Yokoo et al. | |
| 4,696,395 A | | 9/1987 | Rivoli | |
| 4,737,387 A | * | 4/1988 | Yen | 428/14 |
| 4,833,051 A | | 5/1989 | Imamura | |

(Continued)

FOREIGN PATENT DOCUMENTS

EP    1109427    6/2001

(Continued)

OTHER PUBLICATIONS

Official Action issued for ROC (Taiwan) Patent Application No. 092135993, dated Apr. 9, 2007.

(Continued)

*Primary Examiner* — Steven A. Reynolds
(74) *Attorney, Agent, or Firm* — Pillsbury Winthrop Shaw Pittman LLP (57) ABSTRACT

A mask transport system is configured to transport a mask into and out of a lithographic apparatus. The mask transport system includes a first container configured to shield a top side and a bottom side of the mask. At least a portion of the container is at least partially translucent for radiation having a predetermined wavelength used to detect contamination on the top side or the bottom side of the mask when the mask is shielded by the first container. The mask transport system also includes a second container configured to enclose the first container. The second container includes a first part defining a first opening and an openable cover that covers the first opening. The cover is configured to open and release the first container within the lithographic apparatus or at an interface with the lithographic apparatus.

13 Claims, 5 Drawing Sheets

U.S. PATENT DOCUMENTS

| | | | |
|---|---|---|---|
| 4,844,961 | A | 7/1989 | Akao |
| 5,044,500 | A | 9/1991 | Webber et al. |
| 5,305,878 | A | 4/1994 | Yen |
| 5,314,068 | A | 5/1994 | Nakazato et al. |
| 5,397,665 | A | 3/1995 | Tabuchi et al. |
| 5,547,328 | A | 8/1996 | Bonora et al. |
| 5,577,610 | A | 11/1996 | Okuda et al. |
| 5,723,860 | A * | 3/1998 | Hamada et al. ............... 250/239 |
| 5,969,441 | A | 10/1999 | Loopstra et al. |
| 6,015,064 | A | 1/2000 | Liu |
| 6,032,802 | A | 3/2000 | Ejima et al. |
| 6,046,792 | A | 4/2000 | Van Der Werf et al. |
| 6,149,992 | A * | 11/2000 | Nakayama ...................... 428/14 |
| 6,173,834 | B1 * | 1/2001 | Voden et al. ............... 206/315.1 |
| 6,216,873 | B1 * | 4/2001 | Fosnight et al. ............. 206/710 |
| 6,239,863 | B1 | 5/2001 | Catey et al. |
| 6,286,684 | B1 * | 9/2001 | Brooks et al. ................ 206/710 |
| 6,382,419 | B1 | 5/2002 | Fujimori et al. |
| 6,395,436 | B2 * | 5/2002 | Williams .......................... 430/5 |
| 6,427,096 | B1 | 7/2002 | Lewis et al. .................. 700/228 |
| 6,443,302 | B2 * | 9/2002 | Tanaka ....................... 206/316.1 |
| 6,499,935 | B1 | 12/2002 | Hirakawa et al. |
| 6,739,452 | B2 * | 5/2004 | Rochelo ........................ 206/454 |
| 7,000,760 | B2 * | 2/2006 | Lau ................................ 206/6.1 |
| 7,094,505 | B2 * | 8/2006 | Zhang et al. ...................... 430/5 |
| 7,400,383 | B2 * | 7/2008 | Halbmaier et al. ............. 355/72 |
| 2001/0035361 | A1 * | 11/2001 | Mishiro et al. ............. 206/316.1 |
| 2002/0044856 | A1 | 4/2002 | Foulke et al. |
| 2002/0086224 | A1 | 7/2002 | Kanda |
| 2003/0227605 | A1 * | 12/2003 | del Puerto et al. .............. 355/51 |

FOREIGN PATENT DOCUMENTS

| | | |
|---|---|---|
| EP | 1170982 | 1/2002 |
| EP | 1 341 042 A2 | 9/2003 |
| EP | 1 341 045 A1 | 9/2003 |
| EP | 1065532 | 3/2005 |
| EP | 1139176 | 5/2006 |
| JP | 2-310560 | 12/1990 |
| JP | 4-27949 | 1/1992 |
| JP | 4-93947 | 3/1992 |
| JP | 6-334019 | 12/1994 |
| JP | 10-154646 | 6/1998 |
| JP | 10-267860 | 10/1998 |
| JP | 11-94523 | 4/1999 |
| JP | 11-305420 | 11/1999 |
| WO | 98/40791 | 9/1998 |
| WO | 99/49366 | 9/1999 |

OTHER PUBLICATIONS

Japanese Official Action issued for Japanese Application No. 2003-429098, dated Feb. 3, 2006.

* cited by examiner

MASK TRANSPORT SYSTEM CONFIGURED TO TRANSPORT A MASK INTO AND OUT OF A LITHOGRAPHIC APPARATUS

CROSS-REFERENCE TO RELATED APPLICATIONS

This application is a continuation of co-pending U.S. patent application Ser. No. 10/744,095, which was filed on Dec. 24, 2003 and is based on and claims the benefit of priority from European Patent Application No. 02080457.1 filed on Dec. 27, 2002, the entire contents of both of which are incorporated herein by reference.

BACKGROUND OF THE INVENTION

1. Field of the Invention

The present invention relates generally to the field of lithography. More specifically, the present invention is directed to a container for holding a mask for a lithographic apparatus, and a mask transport system configured to transport a mask into and out of a lithographic apparatus.

2. Description of Related Art

Lithographic projection apparatus can be used, for example, in the manufacture of integrated circuits (ICs). In such a case, a patterning device or patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time.

In current apparatus, employing patterning by a mask on a mask table, a distinction can be made between two different types of machines. In one type of lithographic projection apparatus, each target portion is irradiated by projecting the entire mask pattern onto the target portion in one go; such an apparatus is commonly referred to as a wafer stepper or step and repeat apparatus. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction. Since, in general, the projection system will have a magnification factor M (generally <1), and the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system of a lithographic projection apparatus may hereinafter be referred to as the "lens." However, this term should be broadly interpreted as encompassing various types of projection system, including refractive optics, reflective optics, and catadioptric systems, for example. Its radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices, the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both of which are incorporated herein by reference.

The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask table, or mask support, ensures that the mask can be held at a desired position in the incoming radiation beam, and that it can be moved relative to the beam if so desired.

Conventionally, the mask table has been positioned such that radiation is passed from the illumination system through the mask, the projection system, and onto the substrate. Such masks are known as transmissive masks since they selectively allow the radiation from the illumination system to pass through, thereby forming a pattern on the substrate. Such masks must be supported so as to allow the transmission of light therethrough. This has conventionally been achieved by using a vacuum in the table at a perimeter zone of the mask so that the atmospheric air pressure clamps the mask to the table.

In a lithographic apparatus, the size of features that can be imaged onto the wafer is limited by the wavelength of the projection radiation. To produce integrated circuits with a higher density of devices, and, hence, higher operating speeds, it is desirable to be able to image smaller features. While most current lithographic projection apparatus employ ultraviolet light of 365 nm, 248 nm, and 193 nm generated by mercury lamps or excimer lasers, it has been proposed to use shorter wavelength radiation of around 13 nm. Such radiation is termed extreme ultraviolet (EUV, with a wavelength in a range of about 5-20 nm) radiation, and possible sources include laser-produced plasma sources, discharge sources, or synchrotron radiation sources, examples of which are, for example, disclosed in European patent applications EP 1,109,427 A and EP 1,170,982 A, both of which are incorporated herein by reference.

Since no materials are known to date to be sufficiently transparent to EUV radiation, a lithographic projection apparatus employing EUV radiation is envisaged to employ a reflective mask having a multilayer coating of alternating layers of different materials, for example, in the order of 50 periods of alternating layers of molybdenum and silicon or other materials, such as, for example, disclosed in European patent application EP 1,065,532 A, incorporated herein by reference. The size of the features to be imaged in EUV lithography makes the imaging process very sensitive to any contamination present on the mask. It is foreseen that any contaminant particles having a dimension from approximately 25 nm will result in defects present in devices fabricated in the substrate. Therefore, masks are often provided with a pellicle, as will be known to a person skilled in the art. A pellicle makes a mask less sensitive to contamination, since the contamination particles will fall on the pellicle instead of the mask and, as a result of that, will be out of focus.

Pellicles cannot be employed for EUV radiation since they will not be sufficiently transparent to EUV radiation. Particle contamination on the pattern-bearing reflective surface of the mask would therefore lead to defective devices fabricated and must be prevented.

Moreover, the reflective mask is envisaged to be held at its backside on the mask table by electrostatic forces on a mask-bearing surface to be able to meet the very stringent requirements for EUV mask positioning. Any contaminant particle present in between the backside of the mask and the mask-bearing surface of the mask table will cause the mask to be oriented at a tilt with respect to the proper orientation. Since the projection system will be non-telecentric on the object side, because a reflective mask is used (more information on this problem can be derived from European patent application EP 1,139,176 A, incorporated herein by reference), a tilt in the surface figure of the reflective mask surface will translate into a local shift of the pattern imaged onto the substrate. As a result, the imaged layer may not line up with earlier layers that have been processed in the substrates again leading to defective devices fabricated. Therefore, particle contamination on the backside surface of the mask should be prevented.

Molecular type of contamination, such as hydrocarbons and water, should also be prevented. Such contamination will have a detrimental effect on any of the optical components in the lithographic apparatus, including the mask. In all handling procedures of masks and substrates, care should be taken that their surfaces will remain clean from such molecular contamination. Masks and substrates may be stored and transported between various types of apparatus employing a storage box in which a protective environment is maintained, such as an environment that is evacuated or filled with an inert gas. The inside walls of such a storage box should also remain clean. However, while transferring a mask or substrate out of such a storage box to a device or apparatus for processing or employing such a substrate or mask, contamination, both particulate contamination and molecular contamination may be introduced onto mask or substrate or internal walls of a protective environment. One may transfer a mask or substrate through some intermediate chamber, for example, a load lock chamber, to a final environment for processing or use, but then very long pump down times may be required when the protective environment is to be evacuated.

According to the above, it will be understood that lithographic techniques are known to be very sensitive to contamination. Even very small contamination particles on the mask could be projected on the wafer or will cause an error in the positioning of the mask, as discussed above. This can disturb the resulting wafer in such a way, that the wafer becomes useless. Today, such production faults on the wafer can not be detected during the production process, but only afterwards. This involves the risk that a sequence of successively produced wafers are useless and need to be destroyed. Thus, it is important to keep the mask clean during the whole mask handling process and to scan the mask for contamination regularly. However, detecting contamination particles is a difficult and time consuming process. Especially contamination particles that are smaller than the dimensions of the relief on the mask surface are difficult to detect.

In order to minimize the risk of contamination, the mask is produced under very clean circumstances. After production, the mask is placed in a storage box, for storage and transportation to the lithographic projection apparatus. Also, when the mask is removed from the lithographic projection apparatus, for example for a scanning process, the mask is placed in the storage box. Storages boxes and methods for transferring the mask in and out of the lithographic projection apparatus in such a way that the storage box is only opened under very clean conditions are known. The storage box is adapted to be used in combination with a load lock.

In order to scan the mask for contamination, the mask needs to be removed from the lithographic projection apparatus and transported to a scanning assembly. Such a scanning assembly will be explained below, with reference to FIGS. 2a and 2b. Transportation from the lithographic projection apparatus to the scanning assembly and vice versa, can be done in the transport box. However, in order to scan the mask, it is necessary to get the mask out of the storage box. Scanning of the mask can not be done while the mask is inside the storage box. Opening of the storage box forms a big risk for particle contamination. This means that inspection for contamination is a contaminating action. Also, after inspection, the mask is placed in the storage box again, causing possible particle contamination. The result of the scanning process can therefore never be guaranteed.

Second, when kinematic frames need to be applied to the mask after being written, it must be done by also getting the mask out of its storage box and exposing it to a clean room environment. This is also a risk of particle contamination.

SUMMARY OF THE INVENTION

It is an aspect of the present invention to provide a storage and transferring device that protects the mask against contamination, even during the scanning process.

This and other aspects are achieved according to embodiments of the invention, in which a container is at least partially translucent for radiation of at least a predetermined wavelength, the container being formed in such a way that an image can be obtained of the mask from outside the container using light of that wavelength.

The container protects the mask against contamination, even during a scanning operation, since scanning can be done through at least a part of the wall of the container. It is not necessary to open the box for performing a scanning operation. Contamination particles on the container are out of focus for the scanning assembly and can easily be removed, without damaging the mask. The container is particularly suitable for use in lithographic projection apparatus that use extreme ultra violet radiation, since for those wavelengths, conventional pellicles can no longer be used.

In order to achieve a good scanning result, the container should be dimensioned in such a way, that a sharp image of the mask can be obtained. Therefore, the distance between the mask and the translucent part of the container, as well as the thickness of the translucent part, should be within certain design constraints. For example, in a preferred embodiment, using a green laser as a scanning beam, the distance between the mask and the translucent part is preferably between about 2-30 mm. The thickness of the translucent part is preferably as thin as possible, for example, less then about 10 mm.

At least one embodiment provides a mask container that includes a top portion, a bottom portion connected to the top portion, and a support structure configured to support a mask inside of the container. At least one of the top portion and the bottom portion is at least partially translucent for radiation of a least a predetermined wavelength such that an image can be obtained of the mask from outside of the container using light of the predetermined wavelength.

In a further embodiment of the invention, the translucent part of the container is made from at least one of the following materials: glass and plexiglass, which are all suitable materials for forming such a translucent part.

In a further embodiment of the invention, the container comprises a bottom part and a top part, the bottom and top part each comprising connecting members, where the connecting members of the bottom part can connect to the connecting members of the top part. Such a container provides an embodiment of the container that is easy to manufacture and is straightforward in use thereof.

In a further embodiment of the invention, at least one of the top part and the bottom part of the container is at least partially translucent to radiation to allow scanning of at least one side of the mask. Preferably, for optimal performance, both sides of the mask need to be clean. Contamination particles on the patterning side cause projection errors, while contamination particles on the backside of the mask can cause the mask to slightly deform when lying on its backside.

In a further embodiment of the invention, the connecting members of the bottom and/or top part are at least partially porous, to allow pressure difference between the outside and the inside of the container to be neutralized. This makes it possible to close the container in a first environment and to open it in a second environment having a different pressure. The porous connecting members allow pressure differences between the outside and the inside to neutralize.

In a further embodiment of the invention, the container comprises support devices to support the mask. Such support devices are preferably formed to support the mask, using only a minimum, preferably three, contact points.

In a further embodiment of the invention, the support devices are formed as legs extending from the container to the mask. The support devices are preferably high enough to provide room for a robot arm to move between the mask and the bottom part of the container.

In a further embodiment of the invention, the support devices are arranged to support the mask in different directions, so that the mask is clasped. Because of this, the mask is fixed in position, thereby minimizing the risk for damaging the mask resulting from shocks that could, for example, occur during transportation of the mask.

In a further embodiment of the invention the properties of the translucent parts of the container are locally adapted in correspondence with a patterning structure on the mask. Such adaptations could be used by the scanning assembly to distinguish between contamination particles and the pattern.

In a further embodiment of the invention, the translucent parts of the container comprise at least a lens. This may be used, for example, by the scanning assembly or the lithographic projection apparatus to focus on certain indicators on the mask surface. This may increase the accuracy for positioning the mask.

In a further embodiment of the invention, the container fits in a storage box or is a storage box. The storage box is commonly used in the lithographic field of technology. A container according to the invention that fits in such a storage box is a very useful embodiment. Also, a container that doesn't need to be put in a storage box, but is itself a storage box, is also a very useful and cost-effective solution.

According to a further aspect of embodiments of the invention, a method for transferring one or more substrates or masks from a storage box to a device or apparatus for handling, processing or using substrates or masks, or vice versa, the storage box comprising a cover having an openable cover part, and the method comprising: providing the storage box onto an openable wall part of a wall of an enclosed protective environment of the device or apparatus, such that the openable cover part faces the openable wall part, and that, when viewed in the direction from the openable wall part to the openable cover part, the circumscription of the openable wall part coincides with, or encloses the circumscription of the openable cover part, the protective environment being adapted to either be filled with an inert gas or to be evacuated; opening the openable cover part of the storage box and the openable wall part of the protective environment, whereby the cover of the storage box forms part of the wall of the protective environment and an inside of the storage box becomes part of the protective environment; and transferring at least one of the substrates or masks from an inside space of the storage box to a space within the protective environment or vice versa, characterized in that the mask is enclosed by a container as defined above, and that the method further comprises removing the top part and the bottom part of the container, when the mask is transferred from an inside space of the storage box to a space within the protective environment, or the assembling of the top part and the bottom part to enclose the mask when the mask is transferred from the space within the protective environment to the inside space of the storage box.

According to embodiments of the invention, there is provided a method for transferring a mask from a storage box to an enclosed protective environment for handling, processing, or using the mask. The storage box includes a first part that defines a first opening and an openable cover part that covers the opening. The enclosed protective environment includes a second part that defines a second opening and an openable wall part that covers the second opening. The method includes providing the storage box onto the openable wall part of the enclosed protective environment such that the openable cover part faces the openable wall part. The protective environment is adapted to either be filled with an inert gas or be evacuated. The method also includes opening the openable cover part of the storage box and the openable wall part of the protective environment such that the first part of the storage box engages the second part of the protective environment, and transferring the mask from an inside space of the storage box to a space within the protective environment.

According to embodiments of the invention, a method for transferring a mask to a storage box from an enclosed protective environment for handling, processing, or using the mask. The storage box includes a first part that defines a first opening and an openable cover part that covers the opening. The enclosed protective environment includes a second part that defines a second opening and an openable wall part that covers the second opening. The method includes providing the storage box onto the openable wall part of the enclosed protective environment such that the openable cover part faces the openable wall part. The protective environment is adapted to either be filled with an inert gas or be evacuated. The method also includes opening the openable cover part of the storage box and the openable wall part of the protective environment such that the first part of the storage box engages the second part of the protective environment, and transferring the mask to an inside space of the storage box from a space within the protective environment.

According to a further aspect of the invention, there is provided a method of scanning a mask for contamination using a scanner assembly, characterized in that the mask is enclosed by a container according to the invention.

According to a further aspect of the invention, a lithographic projection apparatus is provided. The apparatus includes a storage box for a mask, and an enclosed protective environment in which the mask is handled, processed, or used. The storage box includes a first part defining a first opening and an openable cover that covers the first opening. The enclosed protective environment includes a second part that defines a second opening and an openable wall part that covers the second opening. The enclosed protective environment is adapted to either be filled with an inert gas or be evacuated. The first part of the storage box is configured to engage the second part of the enclosed protective environment. The openable cover and the openable wall part are movable into the enclosed protective environment to enable the mask to be transferred from the storage box to the enclosed protective environment.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EMBODIMENTS OF THE INVENTION

Figure 1:
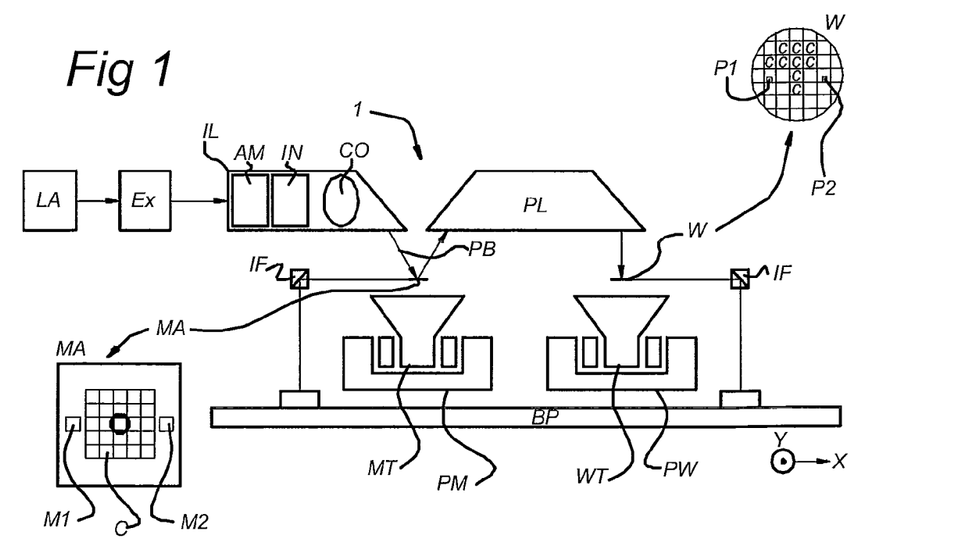
FIG. 1 schematically depicts a lithographic projection apparatus according to an embodiment of the invention.

FIG. 1 schematically depicts a lithographic projection apparatus 1 according to a particular embodiment of the invention. The apparatus comprises a radiation system Ex, IL, for supplying a projection beam PB of radiation (e.g. laser radiation). In this particular case, the radiation system also comprises a radiation source LA; a first object table (mask table) MT provided with a mask holder for holding a mask MA (e.g. a reticle), and connected to a first positioning device PM for accurately positioning the mask with respect to item PL; a second object table (substrate table) WT provided with a substrate holder for holding a substrate W (e.g. a resist coated silicon wafer), and connected to a second positioning device PW for accurately positioning the substrate with respect to item PL; and a projection system ("lens") PL for imaging an irradiated portion of the mask MA onto a target portion C (e.g. comprising one or more dies) of the substrate W. The term object table as used herein can also be considered or termed as an object support. It should be understood that the term object support or object table broadly refers to a structure that supports, holds, or carries a substrate.

As here depicted, the apparatus is of a reflective type (i.e. has a reflective mask). However, in general, it may also be of a transmissive type, for example (with a transmissive mask). Alternatively, the apparatus may employ another kind of a patterning device, such as a programmable mirror array.

The source LA produces a beam of radiation. This beam is fed into an illumination system (illuminator) IL, either directly or after having traversed conditioning means, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross section.

It should be noted, with regard to FIG. 1, that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and an interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2A:
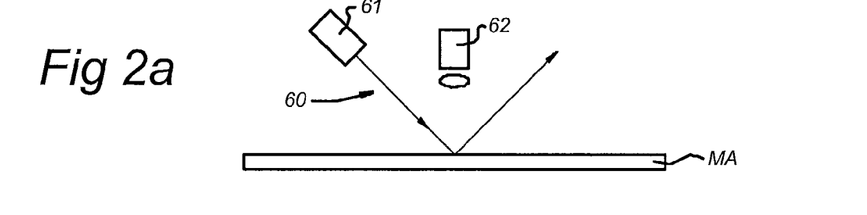
FIGS. 2a and 2b schematically depict a scanning assembly in which a mask can be scanned for contamination.
Figure 2B:
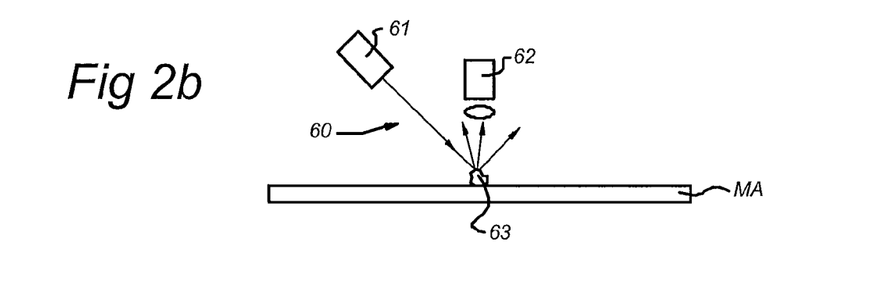

When the mask MA is scanned for contamination, the mask MA is removed from the lithographic projection apparatus and transported to a scanner assembly 60. FIGS. 2a and 2b show a possible embodiment of such a scanner assembly 60 for a reflective mask MA, comprising a light source 61 and a detector 62. The light source 61 projects a light beam, for example, a (green) laser beam, on the surface of the mask MA. When the light beam impinges on a clean part of the mask MA, the mask will reflect the beam, and the beam will not be detected by the detector 62, as is shown in FIG. 2a. If, however, the light beam impinges on a contamination particle 63, the light is scattered and will partially be detected by the detector 62, as is shown in FIG. 2b. The scanning assembly 60 of FIGS. 2a and 2b uses a scattering and reflection differentiation technique to detect contamination particles, but also other scanning techniques can be used. For example, scanning techniques can be used that are also applicable to scan patterned surfaces for particles.

Figure 3:
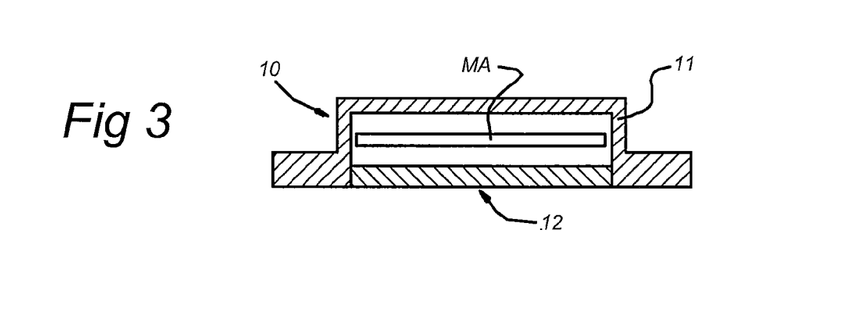
FIG. 3 schematically depicts a storage box in which a mask is stored.

FIG. 3 shows a mask storage box 10, in which an EUV reflective mask MA is stored for transportation, storage and handling purposes. Storage box 10 comprises a top part 11 and a bottom plate 12. Mask MA is held inside storage box 10 on bottom plate 12, for example, by a kinematically-determined holding mechanism as disclosed in European patent application EP 01301864.3, incorporated herein by reference. Inside storage box 10, an atmosphere of a protective (inert) gas may be maintained, for example, at a pressure above ambient pressure. However, a vacuum may also be maintained inside storage box 10. Especially in the latter case, a sufficient sealing is preferably provided between bottom plate 12 and top part 11 to prevent a gas flow between the inside of the storage box and its ambient environment and a resulting contaminated inside environment of the storage box.

Figure 4:
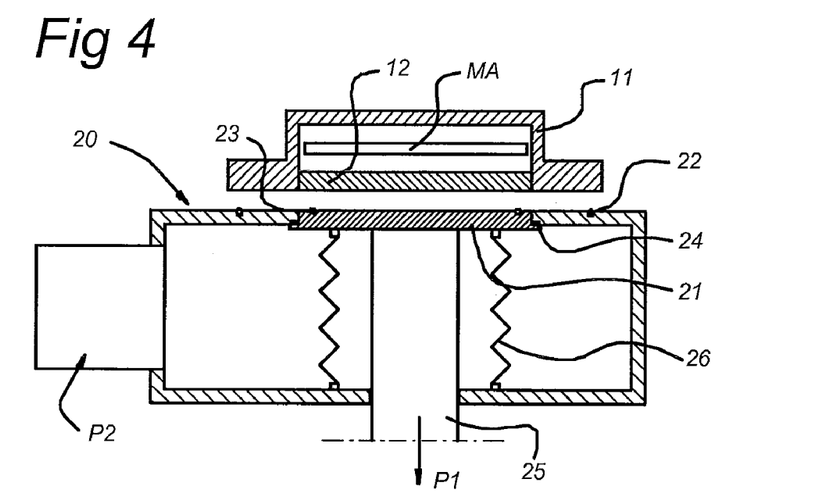
FIG. 4 schematically depicts a storage box on a load lock chamber that is attached to a vacuum chamber of the lithographic apparatus of FIG. 1.

For transferring the mask MA from storage box 10 to the lithographic projection apparatus, the storage box 10 is put onto a so-called load lock 20, which is shown in FIG. 4. Load lock 20 will be connected to vacuum environment of the lithographic apparatus of FIG. 1 by a valve 30, which is further shown in FIG. 5. Storage box 10 is positioned on load lock 20 such that bottom plate 12 of the storage box 10 exactly overlaps with an openable top part 21 of the load lock 20. To this end, a guiding mechanism (not shown) can be provided on the load lock 20 and/or the storage box 10 to properly align the storage box 10 and the openable top of the load lock 20. A clamping mechanism (not shown), is preferably provided to clamp the storage box 10 on the load lock 20 when storage box 10 is properly positioned. A seal 22 is schematically shown between storage box 10 and load lock 20. Seal 22 is preferably provided very close to the bottom plate 12 and openable top 21.

Bottom plate 12 of the storage box 10 and the openable top 21 are now in contact with each other. Cross-sectional shapes of the bottom plate 12 and openable top 21 in a plane perpendicular to the drawing are made so as to have a substantially identical shape. Shapes of contacting surfaces of both elements will therefore match. A seal 23 is preferable provided very close to the circumference in between bottom plate 12 and openable top 21. A pump P1 is preferably provided to be able to evacuate the space between bottom plate 12 and openable top 21.

Openable top 21 of load lock 20 is seen to be provided on an elevator 25 for moving openable top 21 up and down. A seal 24 is provided for sealing top 21 against the upper wall of load lock 20 when top 21 is moved fully upwards against the wall so as constitute a part of it. A bellows 26 is provided around elevator 25 and between top 21 and a bottom wall of load lock 20. Elevator 25 is connected to an appropriate driver (not shown) for moving it up and down. Another pump P2 is provided for evacuating load lock 20.

For transferring a mask MA in mask storage box 10 into load lock 20 one may proceed as follows. At first, the mask is held inside its storage box 10. Care will have been taken that all inside walls of the storage box are very clean so as not to contaminate the mask MA stored inside the box. Both particles and molecular contamination may make the mask MA useless for patterning the projection beam in the lithographic projection apparatus. As discussed above, a vacuum or an inert gas may be provided inside the storage box 10.

Storage box 10 will then be positioned over openable top 21 of a load lock 20 as described above. The contaminated outside surface of bottom plate 12 will overlap the contaminated outside surface of openable top 21. The space in between will be evacuated through elevator 25 using vacuum pump P1.

Dependent on an evacuated or gas-filled space inside storage box 10, one may proceed in various ways. In case the storage box 10 is evacuated, it seems preferable to first evacuate load lock 20 using pump P2 before opening its top 21. In case the storage box is filled with a gas, one may proceed by also first evacuating load lock 20, followed by gently or very suddenly opening top 21 by lowering elevator 25. A gas flow out of the storage box into the load lock 20 will then result, and a sudden gas flow and evacuation of the storage box 10 may help in removing particles that might be present on the mask MA so as to clean it. Another approach would be to first fill the load lock with an (inert) gas followed by lowering top 21 and then evacuating the load lock 20 using pump P2.

Care will also have been taken that all inside surfaces of the load lock 20 will be vary clean. By proceeding as described, the amount of contaminated surface presented to the combined inside space of load lock 20 and storage box 10 is very limited. Such contaminated surfaces might introduce contamination onto the mask MA, but would also dramatically increase pump-down times to the partial pressures (for example of water and hydrocarbons) required for EUV projection lithography.

Figure 5:
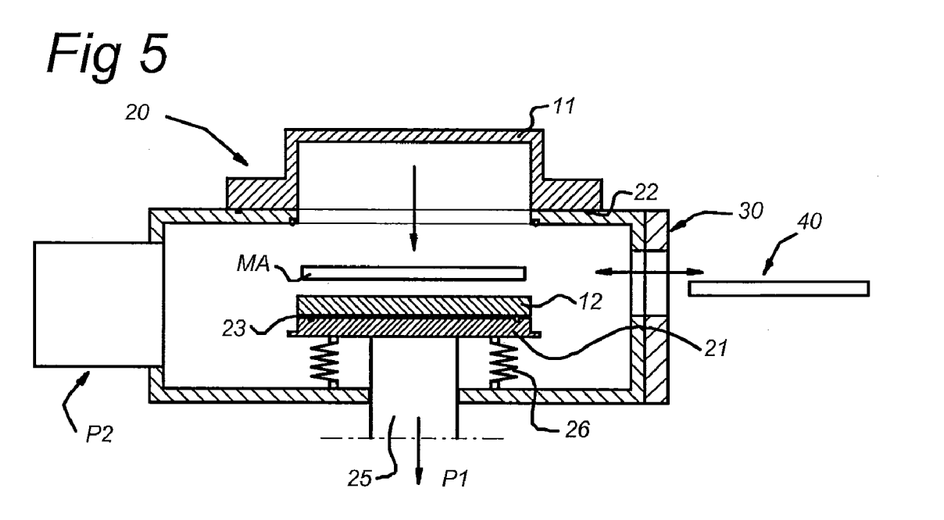
FIG. 5 schematically depicts the storage box on the load lock chamber of FIG. 4, but with the mask lowered into the load lock chamber.

FIG. 5 shows the mask MA lowered out of its storage box 10. The figure further shows a side valve 30 connecting the load lock 20 to another part of the vacuum system of the projection apparatus. Valve 30 in its open position allows access of a gripper 40 to pick up the mask MA and transport it to an internal library, the mask table or any other location, as required. A gripper is disclosed in EP 01301864.3, referred to earlier.

For unloading the mask MA from the projection apparatus into the mask storage box 10, gripper 40 first puts mask MA onto bottom plate 12 that has been lowered by elevator 25, while the inside space of load lock 20 and storage box 10 is evacuated. Subsequently, valve 30 can be closed. The elevator 25 may then be raised to place the mask MA into the storage box 10 and to maintain an evacuated space inside the storage box 10 when bottom plate 12 has closed the box 10. To have an atmosphere of a clean (inert) gas inside the box 10, the space of load lock 20 and storage box 10 is purged with such gas and subsequently elevator 25 is raised to put mask MA into its storage box 20 and to close it by putting bottom plate 12 in place in the bottom part of the box 10.

It will be understood by a person skilled in the art, that the bottom part 12 of the storage box 10 comprises means to ensure a safe and reliable opening of the storage box 10. For example, the bottom part 12 could comprise means that can engage with the top part 11 when the box 10 is closed and that can release the top part 11 when the storage box 10 is opened. This could be achieved, for example, by outwardly projecting pins, that can be pulled back when the storage box 10 is opened.

However, despite the extra protection guaranteed by the storage box 10, the mask MA still needs to be taken out of the storing box 10 for being scanned by the scanning assembly 60. This is needed because the scanning can not be performed through the storage box 10. As already discussed above, opening of the storage box 10 forms a big risk for particle contamination, since the scanning assembly 60 is usually not in a vacuum environment. Because the scanning process itself is a contaminating action a perfect result of the scanning process can therefore never be guaranteed.

A possible solution could be to put the scanning assembly 60 in a vacuum environment. Then the mask MA can enter and exit the scanner in a similar way as described above. However, this is not a less cost-effective solution, since conventional scanning assemblies are usually not very adapted to function in such conditions. Putting the scanning assembly 60 in a vacuum environment is also a more costly solution, that requires more effort from users of lithographic projection apparatus.

Another known solution is to protect the mask MA by using a pellicle, as will be known by a person skilled in the art. Such a pellicle is a protective layer covering the mask MA. Contamination particles that fall on the pellicle will be out of focus, and therefore will not negatively influence the quality of the lithographic process. However, such a pellicle can not be used in all sorts of lithographic projection apparatus. For example, a pellicle can not be used to protect reflective masks used in combination with EUV-radiation, since pellicles are generally not sufficiently transparent to EUV-radiation.

Therefore, it is proposed to build a protective box that protects the mask against contamination, allows for scanning, without the need to open the box in order to scan the mask MA, but can be opened for actually using the mask MA in a lithographic projection apparatus.

Figure 6A:
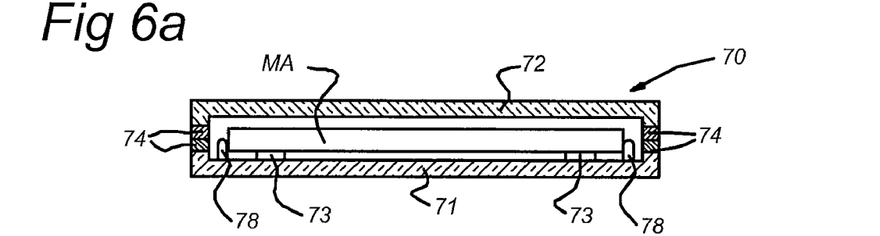
FIGS. 6a and 6b schematically depict a container according to alternative embodiments of the present invention.
Figure 6B:
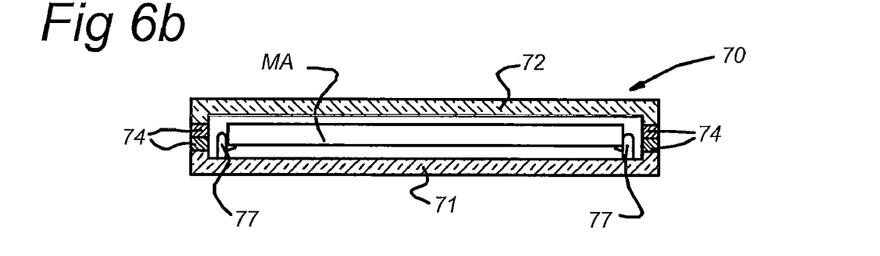

According to a preferred embodiment of the present invention, the mask MA is placed in a transport container 70, that fits in the storage box 10. FIGS. 6a and 6b show possible embodiments of such a transport container 70. The mask MA is preferably placed in the transport container 70 immediately after production or after a scanning procedure, ensuring that the mask MA is free of contamination when it is placed in the transport container 70. The transport container 70 shields the top and bottom side of the mask MA.

Figure 8A:
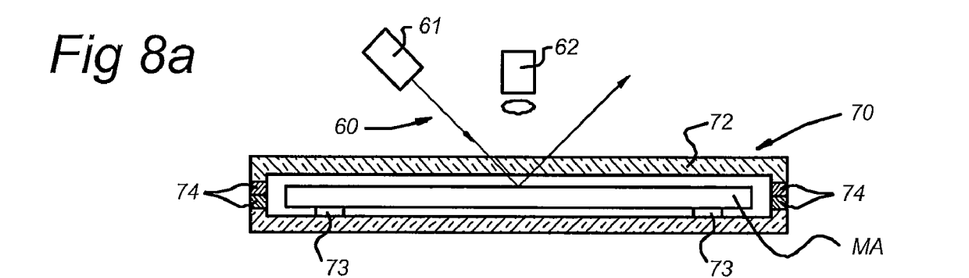
FIGS. 8a and 8b schematically depict a scanning assembly according to FIG. 2, scanning a mask in a container according to FIG. 6.
Figure 8B:
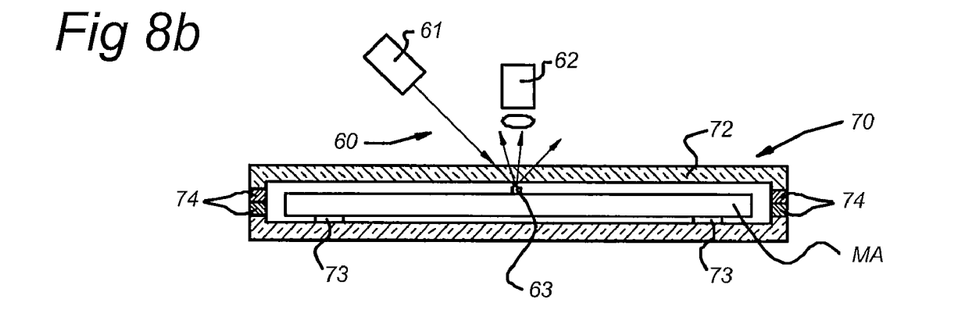

The mask MA, however, should be able to be scanned through the transport container 70 as depicted in FIGS. 8a and 8b. Therefore, the container 70 is preferably at least partially made of translucent layer of material, such as glass or plexiglass. The translucent part of the container preferably has a thickness of less than about 10 mm. Of course, it is also possible to scan the bottom side of the mask MA. Therefore, an extra scanning assembly may be provided to scan the bottom side, but it is also possible to rotate the mask MA in order to do this.

In a preferred embodiment, the transport container 70 comprises a top part 72 and a bottom part 71, that can be connected to each other to enclose mask MA. The bottom and top part 71, 72 each comprise connecting members 74. The connecting members 74 are arranged to connect the bottom part 71 to the top part 72. This can be done using all kinds of techniques, as will be known to a person skilled in the art.

In a preferred embodiment, the connecting members 74 are made from a porous material in order to adapt the pressure inside the transport container 70 to the pressure outside. This can be useful when transporting the transport container from a first environment to a second environment having different pressure conditions.

The top part 72 is preferably positioned approximately 2-30 mm above the surface of the mask MA. This ensures that the scanning assembly can create a sharp image and that contamination particles that fall on the transport container 70 are out of focus and will not be detected by the scanning assembly 60. Such particles can easily be removed, without risk of damaging the mask MA. The translucent part of top part 72 is as thin as possible and has a thickness of preferably less than about 10 mm.

In the embodiment depicted in FIG. 6a, the bottom part 71 further comprises a supporting device 73 to support the mask MA, that can be formed as legs extending from the bottom part 71. In a preferred embodiment, three support devices are provided, since three support points determine a stable position for the mask MA. These support devices 73 can further be used to accurately position the mask MA. This can be done, for example, by providing the mask MA with little notches (not shown) that can engage the support devices 73. The container 70 can further comprise positioning devices 78, for keeping the mask MA from moving in an horizontal direction. FIG. 6b shows an alternative embodiment of the container 70, in which the support devices 73 and the positioning devices 78 are combined in positioning devices 77.

Figure 7:
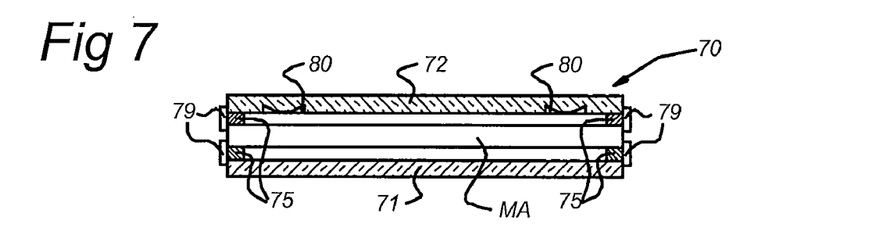
FIG. 7 schematically depicts a container according to an alternative embodiment.

Of course, other connecting members can be thought of, for example, connecting members 75 shown in FIG. 7. These connecting members 75 do not connect to other connecting members, but connect to the bottom part 71, the top part 72, and the mask MA, respectively. In this embodiment, closing devices 79 are needed, to connect the bottom 71 and top part 72 to the mask MA. This solution omits the need for support devices 73, described in FIGS. 6*a* and 6*b*.

FIGS. 8*a* and 8*b* show the scanning of a mask MA in a container 70 by means of a scanning assembly 60, as described with reference to FIGS. 2*a* and 2*b*. Because the container 70 is at least partially translucent to light of certain wavelengths, the scanning process can be done without removing the mask MA from the container 70.

Figure 9:
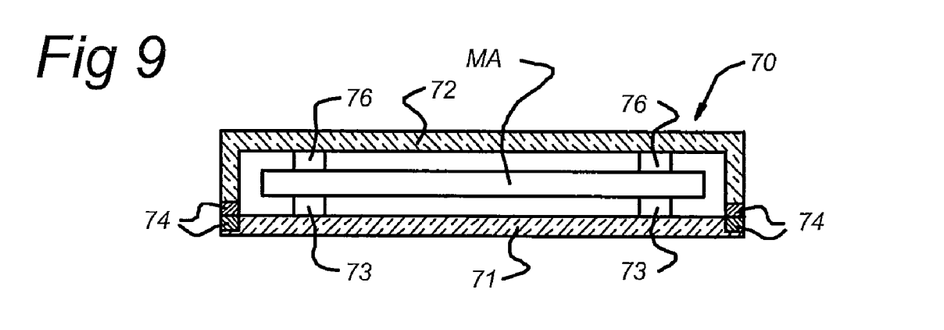
FIG. 9 schematically depicts a container according to yet a further possible embodiment of the present invention.

FIG. 9 depicts an alternative embodiment of the transport container 70, wherein the top and bottom part of the container 70 are formed in such a way that when the top part 72 is removed from the bottom part 71, a robot arm (not shown) can easily maneuver between bottom part 71 and the mask MA, in order to lift the mask MA.

The embodiment shown in FIG. 9 shows support devices 76 provided on the top part 72. These support devices 76 can, in co-operation with the support devices 73 on the bottom part 71, clamp the mask MA. As a result of this clamping, the mask is fixed at its position, minimizing the risk for damage during transport.

Figure 10:
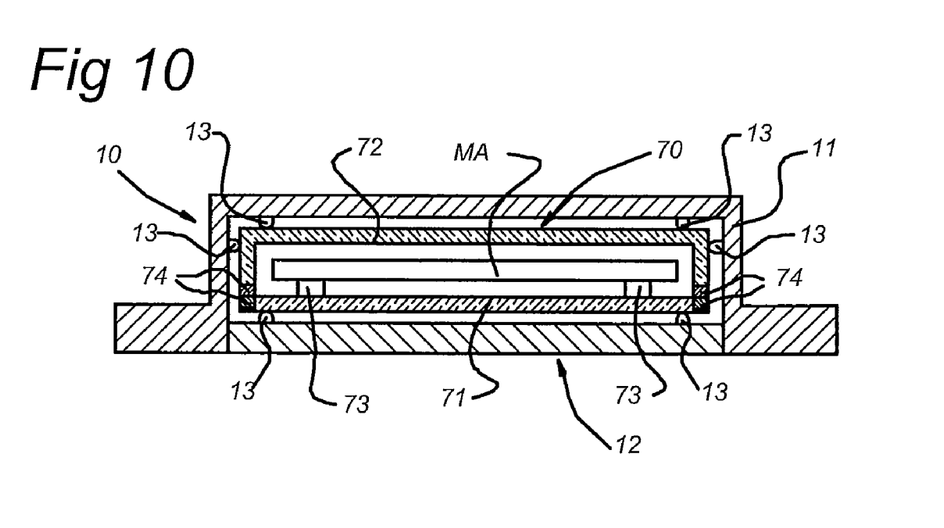
FIG. 10 schematically depicts a container according to a preferred embodiment of the present invention, in combination with a storage box according to FIG. 3.
Figure 11:
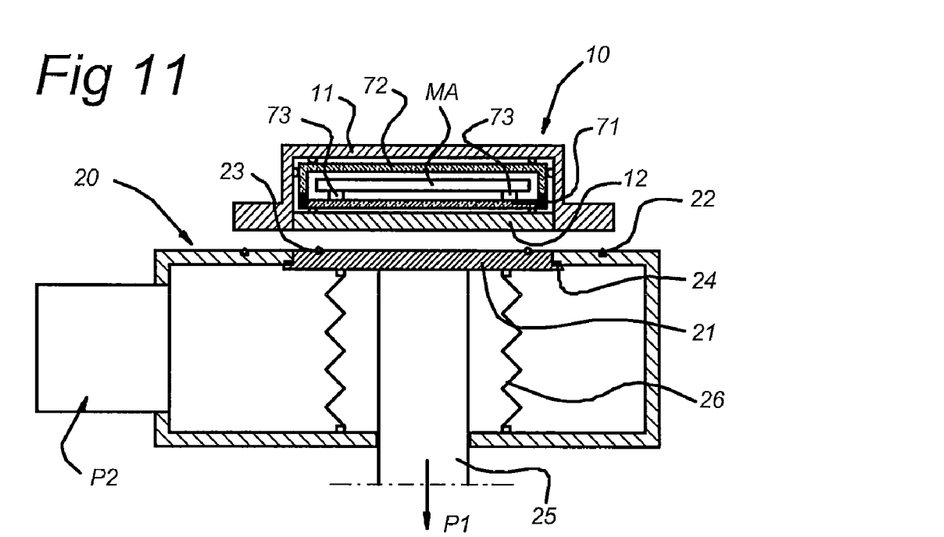
FIG. 11 schematically depicts a storage box in combination with a container according to embodiments of the present invention on a load lock chamber that is attached to a vacuum chamber of the lithographic apparatus of FIG. 1.
Figure 12:
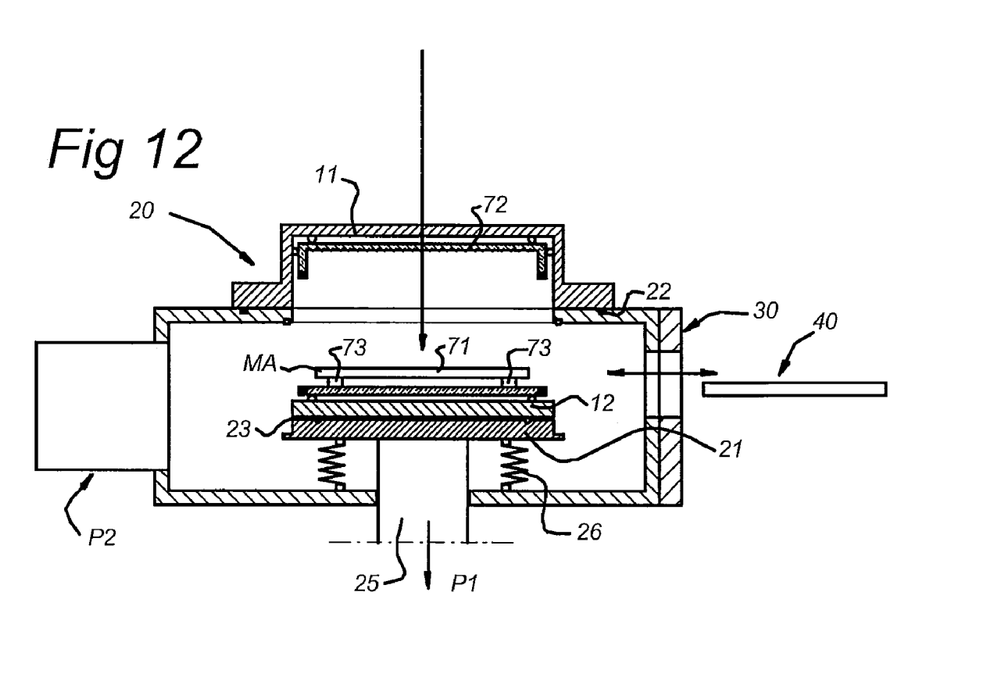
FIG. 12 schematically depicts the storage box with a container according to the present invention on the load lock chamber of FIG. 4, but with the mask lowered into the load lock chamber.

In an alternative embodiment, the transport container 70 is adapted to be used in combination with the load lock 20 as described above. As is depicted in FIG. 10, the transport container 70 fits in a storage box 10. The storage box 10 is provided with a supporting device 13 for positioning the container 70. FIG. 11 and FIG. 12 show a possible use of the storage box 10 and the transport container 70 in combination with the load lock 20. Before the elevator 25 is lowered, the top part 72 of the transport container 70 is connected to the top part 11 of the storage container 10. This can be done using all kinds of techniques, for example, using mechanical or magnetic devices, as will be readily understood by a person skilled in the art. The bottom part 71 of the transport container 70 and the mask MA are lowered with the elevator 25. The support devices 73 are preferably high enough to make room for a robot arm to maneuver between the bottom part 73 of the transport container 70 and the mask MA, in order to pick up the mask MA. It will be understood by a person skilled in the art that this provides an efficient and clean way of bringing the mask MA in, for example, a lithographic projection apparatus. The mask MA is always protected from contamination by the transport container 70, particularly during a scanning procedure. The transport container 70 is only opened by the load lock 20, but inside the load lock 20 there is a very clean environment, minimizing the risk for contamination particles.

In yet a further embodiment, the translucent part of the transport container 70 is provided with optical features. For example, when the mask MA is provided with positioning marks, the translucent part of the transport container 70 can be provided with lenses 80, as are shown in FIG. 7. This could, for example, be used by a positioning system to get a clear sight of those positioning marks and to determine the position of the mask MA with great accuracy.

The translucent part of the transport container 70 could also be provided with further optical features that locally correspond with the patterned structure on the mask MA. Such adaptations could be used by the scanning assembly 60 to distinguish between contamination particles and the pattern. For example, it may be possible to adapt the optical thickness of the translucent part of the transport container 70 to compensate with the local thickness of the mask MA.

While specific embodiments of the invention have been described above, it will be appreciated that the invention may be practiced otherwise than as described. The description is not intended to limit the invention. For example, while embodiments described herein have been directed to containers for masks, it is understood that any type of substrate, such as wafers and the like, may be contained within the containers.

What is claimed is:

1. A mask transport system configured to transport a mask into and out of a lithographic apparatus, the mask transport system comprising:
   a first container configured to shield a top side and a bottom side of the mask, the first container comprising a top portion configured to be connected to the top side of the mask, and a bottom portion configured to be connected to the bottom side of the mask, at least a portion of the first container being at least partially translucent for radiation having a predetermined wavelength used to detect contamination on the top side or the bottom side of the mask when the mask is shielded by the first container; and
   a second container configured to completely enclose the first container, the second container comprising a first part defining a first opening and an openable cover that covers said first opening, the cover being configured to open and release the first container within the lithographic apparatus or at an interface with the lithographic apparatus.

2. The mask transport system according to claim 1, wherein the translucent part of the first container comprises glass.

3. The mask transport system according to claim 1, wherein the translucent part of the first container comprises plexiglass.

4. The mask transport system according to claim 1, wherein the first container further comprises a plurality of connectors configured to connect the top portion to the top side of the mask and to connect the bottom portion to the bottom side of the mask.

5. The mask transport system according to claim 4, wherein the connectors are at least partially porous to allow a pressure difference between the outside and the inside of the first container to be neutralized.

6. The mask transport system according to claim 4, wherein the first container further comprises a plurality of closing devices configured to connect the top portion and the bottom portion to the mask.

7. A mask transport system configured to transport a mask into and out of a lithographic apparatus, the mask transport system comprising:
   a first container configured to shield a top side and a bottom side of the mask, at least a portion of the first container being at least partially translucent for radiation having a predetermined wavelength used to detect contamination on the top side or the bottom side of the mask when the mask is shielded by the first container, the first container comprising a top portion, a bottom portion, and a plurality of connectors configured to connect the top portion and the bottom portion, wherein the connectors are at least partially porous to allow a pressure difference between the outside and, the inside of the first container to be neutralized; and
   a second container configured to completely enclose the first container, the second container comprising a first part defining, a first opening and an openable cover that covers said first opening, the cover being configured to open and release the first container within the lithographic apparatus or at an interface with the lithographic apparatus.

8. The mask transport system according to claim 7, wherein the translucent part of the first container comprises glass.

9. The mask transport system according to claim 7, wherein the translucent part of the first container comprises plexiglass.

10. A mask transport system configured to transport a mask into and out of a lithographic apparatus, the mask transport system comprising:
- a first container configured to enclose the mask, the first container comprising a top portion, a bottom portion connected to the top portion, and a support configured to support the mask inside of the first container, at least one of the top portion and the bottom portion being at least partially translucent for the radiation having the predetermined wavelength used to detect contamination on the mask when the mask is enclosed by the first container; and
- a second container configured to completely enclose the first container, the second container comprising a first part defining a first opening and an openable cover that covers said first opening, the cover being configured to open and release the first container within the lithographic apparatus or at an interface with the lithographic apparatus.

11. The mask transport system according to claim 10, wherein the first container further comprises a plurality of connectors configured to connect the top portion and the bottom portion, wherein the connectors are at least partially porous to allow a pressure difference between the outside and the inside of the first container to be neutralized.

12. The mask transport system according to claim 10, wherein the translucent part of the first container comprises glass.

13. The mask transport system according to claim 10, wherein the translucent part of the first container comprises plexiglass.

* * * * *